(12) United States Patent
Chen et al.

(10) Patent No.: US 10,720,370 B2
(45) Date of Patent: Jul. 21, 2020

(54) SENSOR PACKAGE STRUCTURE

(71) Applicant: KINGPAK TECHNOLOGY INC., Hsin-Chu County (TW)

(72) Inventors: Jian-Ru Chen, Hsin-Chu County (TW); Jo-Wei Yang, Hsin-Chu County (TW); Chung-Hsien Hsin, Hsin-Chu County (TW); Hsiu-Wen Tu, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 16/172,966

(22) Filed: Oct. 29, 2018

(65) Prior Publication Data
US 2019/0355639 A1 Nov. 21, 2019

(30) Foreign Application Priority Data
May 18, 2018 (TW) .............................. 107117000 A

(51) Int. Cl.
*H01L 23/31* (2006.01)
*H01L 27/146* (2006.01)
(52) U.S. Cl.
CPC ...... *H01L 23/3114* (2013.01); *H01L 23/3142* (2013.01); *H01L 27/14618* (2013.01); *H01L 27/14625* (2013.01)

(58) Field of Classification Search
CPC ..... H01L 23/3107–315; H01L 23/3142; H01L 27/1462–14623; H01L 27/14625–14629
See application file for complete search history.

(56) References Cited

U.S. PATENT DOCUMENTS

2008/0303939 A1  12/2008  Hsu et al.
2018/0114804 A1   4/2018  Hsieh

FOREIGN PATENT DOCUMENTS

TW          200703692 A      1/2007

*Primary Examiner* — Amar Movva
(74) *Attorney, Agent, or Firm* — Li & Cai Intellectual Property (USA) Office

(57) ABSTRACT

A sensor package structure includes a substrate, an electronic chip fixed on the substrate by flip-chip bonding, a sealant disposed on the substrate and embedding the electronic chip therein, a sensor chip with a size larger than that of the electronic chip, a light-permeable sheet, a plurality of metal wires electrically connected to the substrate and the sensor chip, and a package body. A bottom surface of the sensor chip is disposed on the sealant to be spaced apart from the electronic chip. A lateral surface of the sensor chip is horizontally spaced apart from that of the sealant by a distance less than or equal to 3 mm. The package body is disposed on the substrate and covers the metal wires as well as the lateral sides of the sealant and the sensor chip. The light-permeable sheet is fixed above the sensor chip through the package body.

7 Claims, 2 Drawing Sheets

SENSOR PACKAGE STRUCTURE

CROSS-REFERENCE TO RELATED PATENT APPLICATION

This application claims the benefit of priority to Taiwan Patent Application No. 107117000, filed on May 18, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a configuration in which a smaller chip is disposed on a substrate, and a larger chip is stacked above the smaller chip. The larger chip is electrically connected to the substrate by wire-bonding at a periphery portion thereof. However, during the wire-bonding process implemented for the conventional sensor package structure, the periphery portion of the larger chip is suspended over the substrate, and hence a force exerted on the larger chip by the wire-bonding often induces defects in the package structure. Moreover, since there is a gap easily formed between the smaller chip and the suspended periphery portion of the larger chip, it is difficult to entirely fill the gap with a packaging compound, which in turn may cause air bubbles within the gap in the conventional sensor package structure.

SUMMARY OF THE DISCLOSURE

In response to the above-referenced technical inadequacies, the present disclosure provides a sensor package structure to effectively improve the issues associated with conventional sensor package structures.

In one aspect, the present disclosure provides a sensor package structure, which includes a substrate, an electronic chip, a sealant, a sensor chip, a light-permeable sheet, a plurality of metal wires, and a package body. The electronic chip is fixed on the substrate by flip-chip bonding. The sealant is disposed on the substrate, and the electronic chip is entirely embedded in the sealant. The sensor chip has a size greater than that of the electronic chip. The sensor chip has a top surface, a bottom surface, and a lateral surface that is connected to the top surface and the bottom surface. The bottom surface of the sensor chip is disposed on the sealant to be spaced apart from the electronic chip. The lateral surface of the sensor chip is horizontally spaced apart from a lateral side of the sealant by a predetermined distance that is less than or equal to 3 mm. The light-permeable sheet is arranged above the top surface of the sensor chip. The metal wires are electrically connected to the substrate and the sensor chip. The package body is disposed on the substrate and covers the lateral side of the sealant and the lateral surface of the sensor chip. The metal wires are entirely embedded in the package body. The light-permeable sheet is fixed above the sensor chip through the package body, and is partially exposed from the package body.

In one aspect, the present disclosure provides a sensor package structure, which includes a substrate, a retaining wall, an electronic chip, a bottom layer, an adhesive layer, a sensor chip, a light-permeable sheet, a plurality of metal wires, and a package body. The retaining wall is disposed on the substrate and encloses an accommodating space. The electronic chip is arranged in the accommodating space and is fixed on the substrate by using flip-chip bonding. The bottom layer is filled in the accommodating space and surrounds a lateral side of the electronic chip. The adhesive layer has a bottom side adhered to the electronic chip and the bottom layer, so that the electronic chip is entirely embedded in the bottom layer and the adhesive layer. The sensor chip has a size greater than that of the electronic chip. The sensor chip has a top surface, a bottom surface, and a lateral surface that is connected to the top surface and the bottom surface. The bottom surface of the sensor chip is adhered to a top side of the adhesive layer. The light-permeable sheet is arranged above the top surface of the sensor chip. The metal wires are electrically connected to the substrate and the sensor chip. The package body is disposed on the substrate and covers a lateral side of the retaining wall and the lateral surface of the sensor chip. The metal wires are entirely embedded in the package body. The light-permeable sheet is fixed above the sensor chip through the package body, and is partially exposed from the package body.

Therefore, the sensor package structure of the present disclosure is provided with the electronic chip embedded in the sealant (or embedded in the bottom layer and the adhesive layer), so that the sensor chip can be disposed on the sealant for the periphery portion to be supported. Accordingly, the sensor chip can effectively withstand a force applied on the periphery portion during the wire bonding process, and the problem of air bubbles being formed in the conventional sensor package structure can be effectively avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art.

First Embodiment

Figure 1:
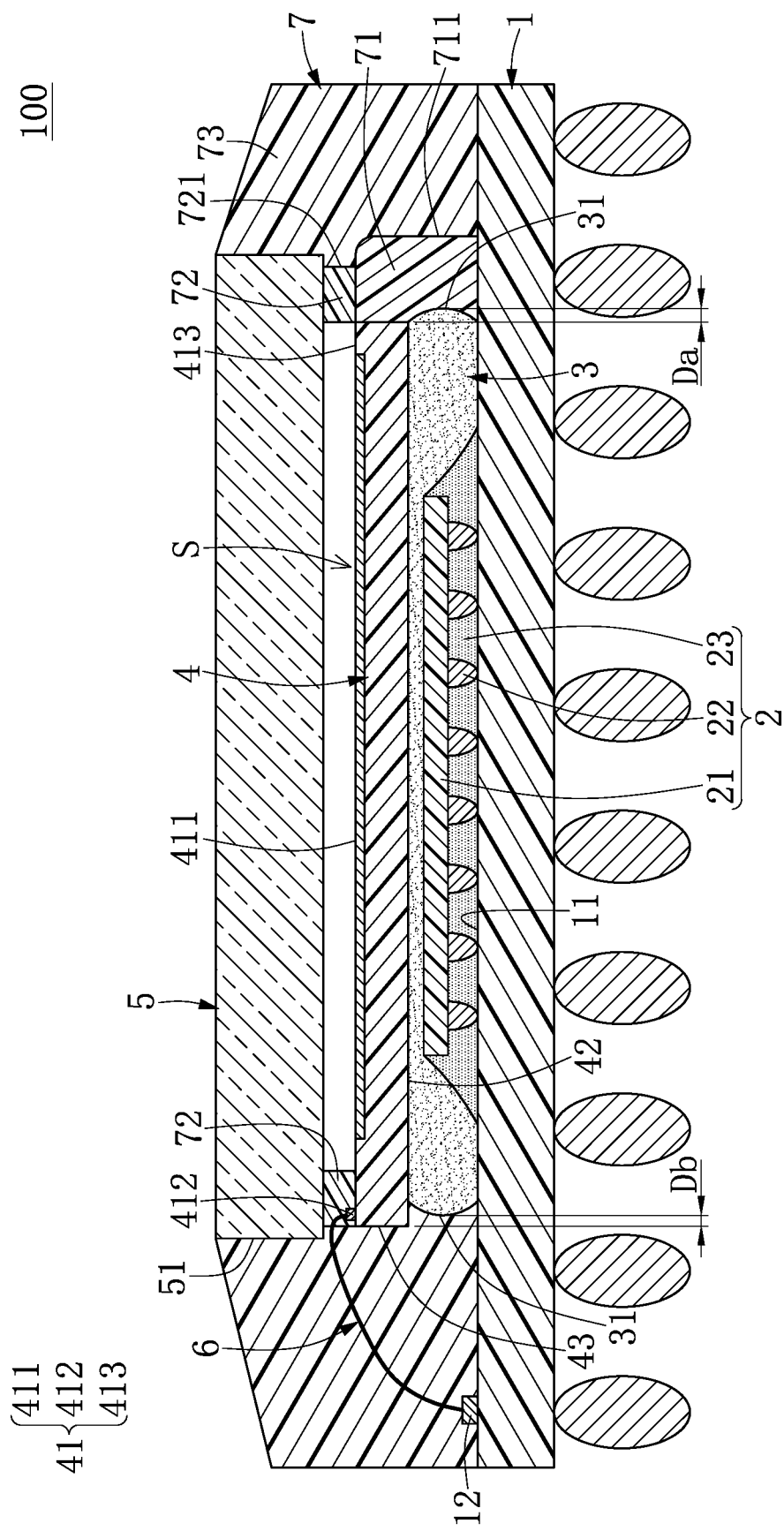
FIG. 1 is a cross-sectional view of a sensor package structure according to a first embodiment of the present disclosure.

Please refer to FIG. 1, which illustrates the first embodiment of the disclosure. The first embodiment discloses a sensor package structure 100 that includes a substrate 1, an electronic chip 2 fixed on the substrate 1 by flip-chip bonding, a sealant 3 disposed on the substrate 1 and entirely embedding the electronic chip 2, a sensor chip 4 disposed on the sealant 3, a light-permeable sheet 5 corresponding in position to the sensor chip 4, a plurality of metal wires 6 electrically connecting the substrate 1 and the sensor chip 4, and a package body 7 disposed on the substrate 1.

It should be noted that FIG. 1 is presented as a cross-sectional view in order to clearly show the sensor package structure 100 of the embodiment. However, it should be realized that the portion of the sensor package structure 100 not shown in the drawing should have corresponding structures similar or identical to those in FIG. 1. For example, FIG. 1 only shows one of the metal wires 6, but the portion of the sensor package structure 100 not shown in FIG. 1 still includes other metal wires 6. The following description recites structure and interconnection of each component of the sensor package structure 100 in the embodiment.

The substrate 1 of the present embodiment is a square shape or a rectangular shape. A top surface of the substrate 1 has a chip fixed region 11 arranged on a substantially center portion thereof, and the substrate 1 includes a plurality of first connecting pads 12 arranged around the chip fixed region 11. Moreover, the substrate 1 may include a plurality of soldering balls (not labeled) disposed on a bottom surface thereof, so that the sensor package structure 100 can be fixed on an electronic component (not shown, such as a printed circuit board) by soldering the soldering balls onto the electronic component.

The electronic chip 2 of the present embodiment is fixed on the chip fixed region 11 of the substrate 1 by flip-chip bonding. That is to say, the electronic chip 2 is arranged beside the first connecting pads 12. Accordingly, since the electronic chip 2 is bonded in a manner other than wire-bonding, the manufacturing cost of the sensor package structure 100 can be effectively reduced, and a short circuit problem between the electronic chip 2 and the sensor chip 4 can be avoided.

Specifically, the electronic chip 2 includes a chip body 21, a plurality of soldering pads 22 disposed on a bottom plane of the chip body 21, and an underfill epoxy 23. The chip body 21 in the embodiment is illustrated as an image signal processor, but the disclosure is not limited thereto. The chip body 21 is soldered onto the chip fixed region 11 of the substrate 1 through the soldering pads 22 (including structural and electrical connections), and a gap between the bottom plane of the chip body 21 and the chip fixed region 11 of the substrate 1 is fully filled with the underfill epoxy 23.

The sealant 3 of the embodiment is integrally formed as a one-piece structure. The sealant 3 is disposed on the substrate 1 and arranged around the chip fixed region 11, and the electronic chip 2 is entirely embedded in the sealant 3. The sealant 3 and the electronic chip 2 may be preferably connected seamlessly. A portion of the sealant 3 arranged above the electronic chip 2 has a smaller thickness, and the other portion of the sealant 3 arranged around the electronic chip 2 has a larger thickness.

Moreover, relative to the electronic chip 2, the sealant 3 in the embodiment is a non-symmetric structure (such as, the length of the left side of the sealant 3 in FIG. 1 is larger than the length of the right side of the sealant 3), but the disclosure is not limited thereto. For example, in other embodiments not shown within the present disclosure, the sealant 3 can be a structure symmetric relative to the electronic chip 2.

In addition, the sealant 3 in the embodiment preferably has a high viscosity, and can be cured by thermal or UV curing, but the disclosure is not limited thereto.

The sensor chip 4 in the embodiment is illustrated as an image sensor chip, but the disclosure is not limited thereto. The sensor chip 4 has a size greater than that of the electronic chip 2. The sensor chip 4 has a top surface 41, a bottom surface 42, and an annular lateral surface 43 that is connected to the top surface 41 and the bottom surface 42. The bottom surface 42 of the sensor chip 4 is disposed on the sealant 3 to be spaced apart from the electronic chip 2. In the embodiment, a central axis of the sensor chip 4 preferably coincides with that of the electronic chip 2, but the disclosure is not limited thereto.

Moreover, the top surface 41 of the sensor chip 4 has a sensing region 411 arranged on a substantially center portion thereof. The sensor chip 4 includes a plurality of second connecting pads 412 arranged around the sensing region 411, and the second connecting pads 412 correspond in position and number to the first connecting pads 12. In more detail, the top surface 41 of the sensor chip 4 has a non-wiring region 413 that is connected to the lateral surface 43 of the sensor chip 4 and does not contact the metal wires 6. That is to say, there is no second connecting pad 412 disposed on the non-wiring region 413. Accordingly, the size of the sensor chip 4 is further reduced.

Specifically, the lateral surface 43 of the sensor chip 4 is horizontally displaced from an annular lateral side 31 of the sealant 3 by a predetermined distance (Da at the right side, Db at the left side) that is less than or equal to 3 mm. The predetermined distance Da, Db in the embodiment is preferably 1 mm, but the disclosure is not limited thereto. A first part of the lateral side 31 of the sealant 3 (e.g., a right part of the lateral side 31 of the sealant 3 shown in FIG. 1) outwardly protrudes from the lateral surface 43 of the sensor chip 4 by the predetermined distance Da. A second part of the lateral side 31 of the sealant 3 is inwardly contracted from and does not exceed the lateral surface 43 of the sensor chip 4 (e.g., a left part of the lateral side 31 of the sealant 3 shown in FIG. 1 is arranged between the sensor chip 4 and the substrate 1) to form the predetermined distance Db with respect to the lateral surface 43, but the present disclosure is not limited thereto.

For example, in other embodiments not illustrated in the disclosure, the two parts of the lateral side 31 of the sealant 3 can outwardly protrude from the lateral surface 43 of the sensor chip 4 by the predetermined distance Da; or, the two parts of the lateral side 31 of the sealant 3 are inwardly contracted from and do not exceed the lateral surface 43 of the sensor chip 4 to form the predetermined distance Db.

The light-permeable sheet 5 in the embodiment is illustrated as a transparent glass plate, but the disclosure is not limited thereto. The light-permeable sheet 5 is arranged above the top surface 41 of the sensor chip 4 through the package body 7 and faces the sensing region 411 of the sensor chip 4. The light-permeable sheet 5, the package body 7, and the sensor chip 4 jointly define a sealing space S.

Moreover, the size of the light-permeable sheet 5 in the embodiment is larger than that of the sensor chip 4. In other words, the sensor chip 4 in the embodiment is inside an area formed by orthogonally projecting the light-permeable sheet 5 onto the substrate 1. Accordingly, the sensor package structure 100 can be configured to package the sensor chip 4 having a smaller size, but the disclosure is not limited thereto. For example, in other embodiments not illustrated in the disclosure, the size of the light-permeable sheet 5 may be smaller than or equal to that of the sensor chip 4.

Each of the metal wires 6 has a first end and a second end that is opposite to the first end. The first ends of the metal wires 6 are respectively connected to the first connecting pads 12 of the substrate 1, and the second ends of the metal wires 6 are respectively connected to the second connecting pads 412 of the sensor chip 4, so that the substrate 1 and the sensor chip 4 are electrically connected to each other through the metal wires 6.

The package body 7 is disposed on the substrate 1. The package body 7 covers the lateral side 31 of the sealant 3 and the lateral surface 43 of the sensor chip 4. The metal wires 6 are entirely embedded in the package body 7. Moreover, the light-permeable sheet 5 is arranged above the sensor chip 4 through the package body 7, and is partially exposed from the package body 7 (e.g., a top surface of the light-permeable sheet 5 shown in FIG. 1). The package body 7 in the embodiment encompasses a periphery portion (e.g., an annular lateral surface 51 and a part of a bottom surface) of the light-permeable sheet 5 so as to position the light-permeable sheet 5 above the sensor chip 4, but the disclosure is not limited thereto.

Specifically, the package body 7 in the embodiment includes an extension piece 71, a support piece 72, and a covering piece 73. The material of the covering piece 73 in the embodiment is different from that of the sealant 3. However, in other embodiments not illustrated in the disclosure, the materials of the extension piece 71, the support piece 72, and the covering piece 73 can be adjusted according to design requirements as long as the sensor package structure 100 shown in FIG. 1 can be carried out. That is to say, the extension piece 71, the support piece 72, and the covering piece 73 can be made of the same material or different materials.

The extension piece 71 is disposed on the substrate 1 and is arranged adjacent to the non-wiring region 413. A height of the extension piece 71 with respect to the substrate 1 is preferably equal to a height of the non-wiring region 413 with respect to the substrate 1. In the embodiment, the extension piece 71 connects a portion of the lateral surface 43 of the sensor chip 4 that is adjacent to the non-wiring region 413. The first part of the lateral side 31 of the sealant 3, outwardly protruding from the lateral surface 43 of the sensor chip 4, is preferably embedded in the extension piece 71.

Moreover, the extension piece 71 in the embodiment is seamlessly connected to the lateral side 31 of the sealant 3, and the part of the lateral side 31, which connects to the extension piece 71, is preferably excluded being contracted from the lateral surface 43 of the sensor chip 4, thereby preventing a gap from being generated between the extension piece 71 and the lateral side 31 of the sealant 3.

A portion of the support piece 72 is sandwiched between the top surface 41 of the sensor chip 4 and the light-permeable sheet 5, and the other portion of the support piece 72 is sandwiched between the extension piece 71 and the light-permeable sheet 5. However, in other embodiments not illustrated in the disclosure, the package body 7 can be provided without the extension piece 71, i.e., the left half and the right half of the sensor package structure 100 are symmetric to each other, so that the support piece 72 could be entirely sandwiched between the top surface 41 of the sensor chip 4 and the light-permeable sheet 5. According to above, the support piece 72 is at least partially sandwiched between the top surface 41 of the sensor chip 4 and the light-permeable sheet 5.

The covering piece 73 in the embodiment is disposed on the substrate 1, and covers at least a part of the lateral side 31 of the sealant 3, at least a part of the lateral surface 43 of the sensor chip 4, an annular outer lateral side 721 of the support piece 72, the lateral surface 51 and a part of the bottom surface of the light-permeable sheet 5, and an outer lateral side 711 of the extension piece 71.

Moreover, in the embodiment, a portion of each of the metal wires 6 and the corresponding second connecting pad 412 are embedded in the support piece 72, and the other portion of each of the metal wires 6 and the corresponding first connecting pad 12 are embedded in the covering piece 73, but the disclosure is not limited thereto. For example, in other embodiments not illustrated in the disclosure, the first connecting pads 12, the second connecting pads 412, and the metal wires 6 can be embedded in the covering piece 73.

In addition, the covering piece 73 in the embodiment is illustrated by solidifying a liquid compound, but the disclosure is not limited thereto. For example, in other embodiments not illustrated in the disclosure, the sensor package structure 100 can further include a molding compound formed on the covering piece 73, or the covering piece 73 is formed by molding.

Second Embodiment

Figure 2:
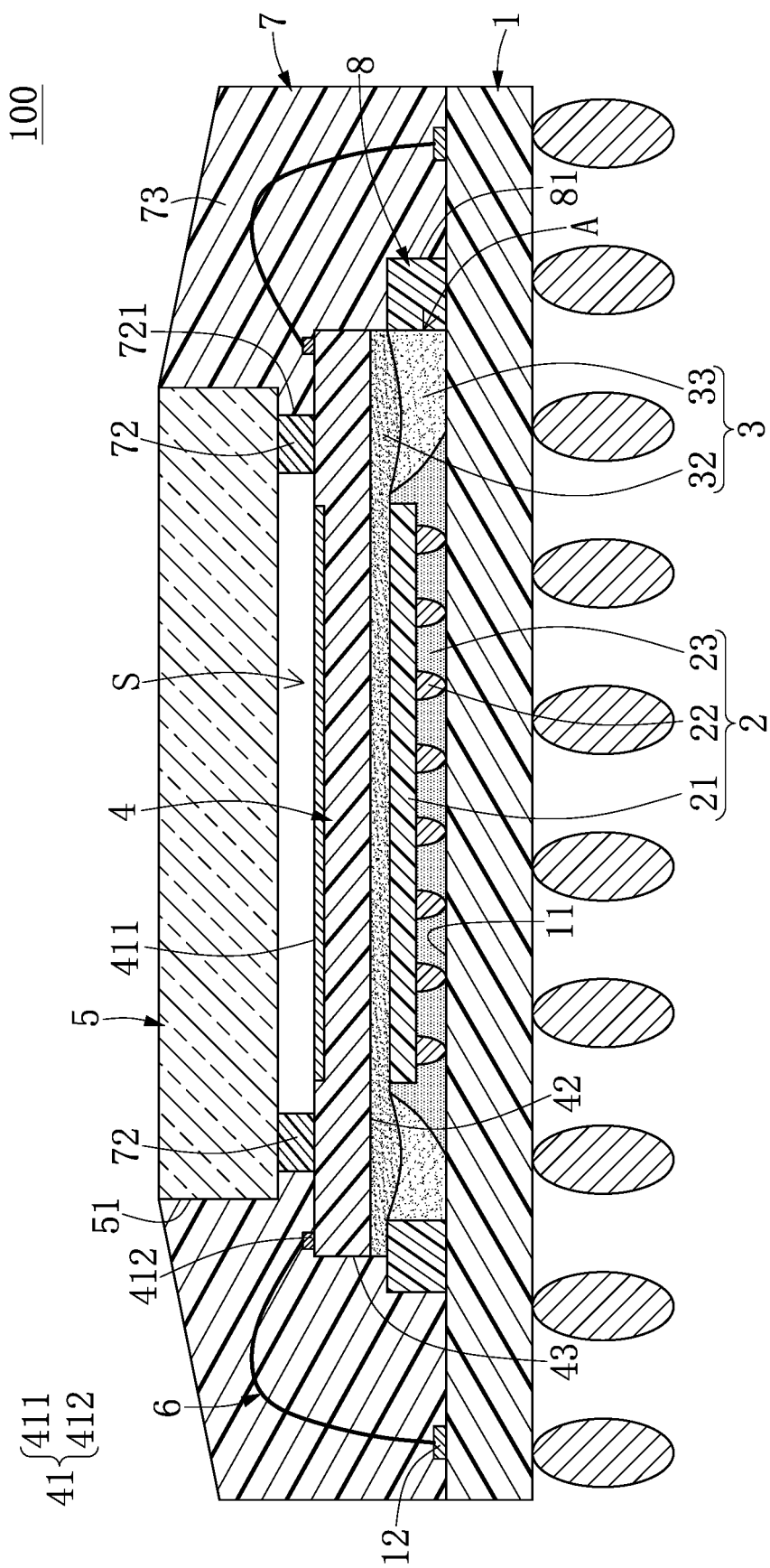
FIG. 2 is a cross-sectional view of the sensor package structure according to a second embodiment of the present disclosure.

A reference is made to FIG. 2 which shows a second embodiment of the disclosure. The present embodiment is similar to the first embodiment, the common points between the embodiments shall not be recited again, and the main distinction of the embodiment differing from the first embodiment is described as follows. The sensor package structure 100 in this embodiment further includes a retaining wall 8, the sealant 3 includes a bottom layer 32 and an adhesive layer 33, and some components of the sensor package structure 100 are disposed in correspondence to the retaining wall 8.

Specifically, the retaining wall 8 in the embodiment is ring-shaped, and the retaining wall 8 is disposed on the substrate 1 to encompass an accommodating space A therein. The electronic chip 2 is arranged in the accommodating space A and mounted on the substrate 1 by flip-chip bonding. The bottom layer 32 is filled in the accommodating space A and surrounds an annular lateral side of the electronic chip 2. The adhesive layer 33 has a bottom side adhered to the electronic chip 2 and the bottom layer 32, so that the electronic chip 2 is entirely embedded in the bottom layer 32 and the adhesive layer 33. The bottom surface 42 of the sensor chip 4 is adhered to or disposed on a top side of the adhesive layer 33.

Moreover, a part of the lateral surface 43 of the sensor chip 4 (e.g., a left part of the lateral surface 43 of the sensor chip 4 shown in FIG. 2) is arranged above the retaining wall 8, and another part of the lateral surface 43 of the sensor chip 4 (e.g., a right part of the lateral surface 43 of the sensor chip 4 shown in FIG. 2) is arranged above the bottom layer 32 and is substantially flush with an adjacent edge of the bottom layer 32, but the disclosure is not limited thereto. For example, in other embodiments not illustrated in the disclosure, the lateral surface 43 of the sensor chip 4 can be entirely arranged above the retaining wall 8 or the bottom layer 32. According to above, at least a part of the lateral surface 43 of the sensor chip 4 of the present disclosure can be arranged above the retaining wall 8 or the bottom layer 32.

The package body 7 is disposed on the substrate 1, and covers an annular outer lateral side 81 of the retaining wall 8 and the lateral surface 43 of the sensor chip 4.

Specifically, the package body 7 in the embodiment includes a support piece 72 and a covering piece 73. The support piece 72 in the embodiment is entirely sandwiched between the top surface 41 of the sensor chip 4 and the light-permeable sheet 5, but the disclosure is not limited thereto. In other embodiments, the support piece 72 can be at least partially sandwiched between the top surface 41 of the sensor chip 4 and the light-permeable sheet 5. Moreover, the covering piece 73 connects (or covers) the lateral side 81 and at least a part of a top side of the retaining wall 8, at least a part of the lateral surface 43 and a part of the top surface 41 of the sensor chip 4, an annular outer lateral side 721 of the support piece 72, and the lateral surface 51 and a part of the bottom surface of the light-permeable sheet 5.

In conclusion, the sensor package structure 100 of the present disclosure is provided with the electronic chip 2 embedded in the sealant 3 (or embedded in the bottom layer 32 and the adhesive layer 33), so that the sensor chip 4 can be disposed on the sealant 3. As a result, a periphery portion of the sensor chip 4 can be supported by the sealant 3. Accordingly, the sensor chip 4 can effectively withstand an external force applied on the sensor chip 4 during a wire bonding process, and the problem of air bubbles being formed in the conventional sensor package structure can be effectively prevented.

Moreover, the sensor package structure 100 of the disclosure is formed with the predetermined distance Da, Db between the lateral surface 43 of the sensor chip 4 and the lateral side 31 of the sealant 3, so as to allow the package body 7 (or the covering piece 73) to be filled into a gap between the sensor chip 4 and the substrate 1, which further prevents air bubbles from being formed.

In addition, the electronic chip 2 is mounted onto the chip fixed region 11 of the substrate 1 by flip-chip bonding (that is, the electronic chip 2 is bounded by a manner other than wire-bonding), the manufacturing cost of the sensor package structure 100 can be effectively reduced, and a short circuit problem between the electronic chip 2 and the sensor chip 4 can be avoided as well.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate;
   an electronic chip fixed on the substrate by flip-chip bonding;
   a sealant disposed on the substrate, wherein the electronic chip is entirely embedded in the sealant;
   a sensor chip having a size greater than that of the electronic chip, wherein the sensor chip has a top surface, a bottom surface, and a lateral surface that is connected to the top surface and the bottom surface; the bottom surface of the sensor chip is disposed on the sealant to be spaced apart from the electronic chip; the lateral surface of the sensor chip is horizontally spaced apart from a lateral side of the sealant by a predetermined distance that is less than or equal to 3 mm;
   a light-permeable sheet arranged above the top surface of the sensor chip;
   a plurality of metal wires electrically connected to the substrate and the sensor chip; and
   a package body disposed on the substrate and covering the lateral side of the sealant and the lateral surface of the sensor chip, wherein the metal wires are entirely embedded in the package body; the light-permeable sheet is fixed above the sensor chip through the package body, and is partially exposed from the package body.

2. The sensor package structure according to claim 1, wherein the electronic chip includes a chip body, a plurality of soldering pads disposed at a lower surface of the chip body, and an underfill epoxy; the chip body is soldered onto the substrate through the soldering pads, and the underfill epoxy fills a space between the lower surface of the chip body and the substrate.

3. The sensor package structure according to claim 1, wherein the package body includes:
   a support piece at least partially sandwiched between the top surface of the sensor chip and the light-permeable sheet; and
   a covering piece covering at least a part of the lateral side of the sealant, at least a part of the lateral surface of the sensor chip, a lateral side of the support piece, and a lateral surface of the light-permeable sheet, wherein the material of the covering piece is different from that of the sealant.

4. The sensor package structure according to claim 3, wherein a portion of each of the metal wires is embedded in the support piece, and the other portion of each of the metal wires is embedded in the covering piece.

5. The sensor package structure according to claim 3, wherein the top surface of the sensor chip has a non-wiring region that is connected to the lateral surface of the sensor chip and does not contact the metal wires; the package body further includes an extension piece disposed on the substrate and arranged adjacent to the non-wiring region; a portion of the support piece is sandwiched between the top surface of the sensor chip and the light-permeable sheet, and the other portion of the support piece is sandwiched between the extension piece and the light-permeable sheet; the covering piece covers a lateral side of the extension piece.

6. The sensor package structure according to claim 5, wherein at least a part of the lateral side of the sealant protrudes outwardly from the lateral surface of the sensor chip and is embedded in the extension piece.

7. The sensor package structure according to claim 1, wherein the sealant is a one-piece structure formed integrally.

* * * * *